United States Patent
Tsuchi

(10) Patent No.: US 12,483,245 B2
(45) Date of Patent: Nov. 25, 2025

(54) OUTPUT BUFFER CIRCUIT, CHARGE PUMP DEVICE, DISPLAY DRIVE DEVICE, AND DISPLAY DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 154 days.

(21) Appl. No.: 18/470,380

(22) Filed: Sep. 19, 2023

(65) Prior Publication Data

US 2024/0106434 A1   Mar. 28, 2024

(30) Foreign Application Priority Data

Sep. 27, 2022 (JP) ................ 2022-153491

(51) Int. Cl.
*H03K 19/003* (2006.01)
*G09G 3/20* (2006.01)

(52) U.S. Cl.
CPC ..... *H03K 19/00361* (2013.01); *G09G 3/2092* (2013.01); *G09G 2310/0291* (2013.01); *G09G 2330/021* (2013.01); *G09G 2330/028* (2013.01)

(58) Field of Classification Search
CPC .......... H03K 19/003; H03K 19/00315; H03K 19/00345; H03K 19/00361; H03K 19/0175; H03K 19/017509; H03K 19/0185; H03K 19/018507
See application file for complete search history.

(56) References Cited

U.S. PATENT DOCUMENTS

| | | | |
|---|---|---|---|
| 10,637,448 B1* | 4/2020 | Sakurai | H03K 3/0377 |
| 2007/0007996 A1* | 1/2007 | Ranganathan | H03K 19/00361 |
| | | | 326/34 |
| 2007/0052447 A1* | 3/2007 | Koike | H03K 19/0013 |
| | | | 326/87 |
| 2014/0292379 A1* | 10/2014 | Itonaga | H03K 19/00 |
| | | | 327/109 |
| 2024/0097685 A1* | 3/2024 | Hwang | H03K 19/018521 |
| 2024/0106434 A1* | 3/2024 | Tsuchi | G09G 3/2092 |
| 2024/0113712 A1* | 4/2024 | Tsuchi | H03K 19/00315 |
| 2024/0144853 A1* | 5/2024 | Tsuchi | H03K 19/018521 |
| 2024/0195419 A1* | 6/2024 | Tran | H03K 19/00315 |
| 2024/0321169 A1* | 9/2024 | Tsuchi | G09G 3/2092 |

FOREIGN PATENT DOCUMENTS

JP    2001217706    8/2001

* cited by examiner

*Primary Examiner* — Jason M Crawford
(74) *Attorney, Agent, or Firm* — JCIPRNET

(57) ABSTRACT

An output buffer circuit includes: a first transistor supplying a first power supply voltage to a first node upon turning on in response to an input signal; a second transistor supplying a second power supply voltage to a second node upon turning on in response to the input signal; a third transistor connecting between the first and second nodes upon turning on in response to a reverse phase signal of a signal on the first node; a fourth transistor connecting between the first and second nodes upon turning on in response to a reverse phase signal of a signal on the second node; a fifth transistor supplying the first power supply voltage upon turning on in response to the signal on the first node; and a sixth transistor supplying the second power supply voltage upon turning on in response to the signal on the second node.

2 Claims, 7 Drawing Sheets

OUTPUT BUFFER CIRCUIT, CHARGE PUMP DEVICE, DISPLAY DRIVE DEVICE, AND DISPLAY DEVICE

CROSS-REFERENCE TO RELATED APPLICATION

This application claims the priority benefit of Japan application serial no. 2022-153491, filed on Sep. 27, 2022. The entirety of the above-mentioned patent application is hereby incorporated by reference herein and made a part of this specification.

BACKGROUND

Technical Field

The disclosure relates to an output buffer circuit that drives a load, a charge pump device, a display drive device, and a display device.

Related Art

In a display device that displays an image based on a video signal on a display panel such as a liquid crystal display panel and an organic EL display panel, a display drive device is included to generate various signals for driving the display panel and supply the signals to the display panel.

Such a display drive device is provided with a charge pump circuit and a drive circuit that drives the charge pump circuit. Based on at least two external power supply voltages supplied from a system, the charge pump circuit generates a power supply voltage for generating the various signals by taking one of the two external power supply voltages as reference and amplifying a voltage difference from the other of the two external power supply voltages.

The charge pump circuit includes, for example, a capacitive element, and generates a power supply voltage having a desired voltage value obtained by boosting or stepping down the other of the two external power supply voltages by alternately switching between a charge operation and a discharge operation with the two external power supply voltages at one terminal of the capacitive element according to the drive signal supplied from the drive circuit.

For example, when generating a boosted power supply voltage, the drive circuit generates a binary signal that prompts switching of the charge operation and the discharge operation of the capacitive element based on a CLK cycle of an inputted clock CLK signal in the case where a detection voltage following the power supply voltage generated by the charge pump circuit is equal to or less than a predetermined reference voltage, and generates a one-value signal that stops switching of the charge operation/discharge operation of the capacitive element in the case where the detection voltage is higher than the predetermined reference voltage. The drive circuit then supplies, to the charge pump circuit, a signal obtained by amplifying the binary signal by an output buffer included in the drive circuit as the drive signal.

The output buffer is composed of a P-channel metal oxide semiconductor (MOS) transistor and an N-channel MOS transistor, each receiving the binary signal at a respective gate terminal, and each having a drain terminal connected to an output node. With such a configuration, the output buffer outputs the drive signal from the output node by complementarily setting the two transistors to an on state according to the binary signal.

However, in such an output buffer driving the charge pump circuit, the capacitance value of the capacitive element that determines the current drive capability of the charge pump circuit is large, and the size of the two transistors of the output buffer driving one terminal of the capacitive element is also large. Thus, if the timing at which one of the two transistors switches from the on state to the off state is delayed with respect to the timing at which the other of the two transistors switches from the off state to the on state, the two transistors temporarily turn on simultaneously, and a large through current flows between the two. Accordingly, power consumption may increase and power supply noise may occur.

Thus, a buffer circuit has been proposed to include a timing adjustment part 20 that is provided at a front stage of the output buffer and adjusts the switching timing from the on (off) state to the off (on) state of each transistor to prevent simultaneous turn-on of the two transistors (see FIG. 1 of Patent Document 1 (Japanese Patent Application Laid-Open No. 2001-217706), for example). This timing adjustment part 20 included in the buffer circuit is composed of an OR circuit 21 and an AND circuit 22 having an output terminal connected to one input terminal of each other.

Each of the OR circuit 21 and the AND circuit 22 forming the timing adjustment part 20 described in Patent Document 1 is composed of six transistors. Each transistor forming the OR circuit 21 and the AND circuit 22 is configured in a relatively large size capable of causing the two transistors of the output buffer having a large size to quickly turn on and off.

Thus, according to the timing adjustment part 20, a total of twelve transistors are required for preventing a through current flowing between the two transistors of the output buffer circuit, and the circuit area of the output buffer becomes large.

SUMMARY

An output buffer circuit according to an embodiment of the disclosure outputs, from an output terminal, an output signal in phase with an input signal received at an input terminal. The output buffer circuit includes a first transistor of a first conductivity type, a second transistor of a second conductivity type, a third transistor of the first conductivity type, a fourth transistor of the second conductivity type, a fifth transistor of the first conductivity type, and a sixth transistor of the second conductivity type. The first transistor receives the input signal at a control terminal of the first transistor and, upon turning on in response to the input signal, supplies a first power supply voltage to a first node. The second transistor receives the input signal at a control terminal of the second transistor and, upon turning on in response to the input signal, supplies a second power supply voltage to a second node. The third transistor receives, at a control terminal of the third transistor, a signal of a phase reverse to a signal on the first node as a first reverse phase signal and, upon turning on in response to the first reverse phase signal, connects between the first node and the second node. The fourth transistor receives, at a control terminal of the fourth transistor, a signal of a phase reverse to a signal on the second node as a second reverse phase signal and, upon turning on in response to the second reverse phase signal, connects between the first node and the second node. The fifth transistor receives the signal on the first node at a control terminal of the fifth transistor and, upon turning on in response to the signal on the first node, supplies the first power supply voltage to the output terminal. The sixth transistor receives the signal on the second node at a control terminal of the sixth transistor and, upon turning on in response to the signal on the second node, supplies the second power supply voltage to the output terminal.

Further, an output buffer circuit according to an embodiment of the disclosure outputs, from an output terminal, an output signal of a phase reverse to an input signal received at an input terminal. The output buffer circuit includes a first transistor of a first conductivity type, a second transistor of a second conductivity type, a third transistor of the first conductivity type, a fourth transistor of the second conductivity type, a fifth transistor of the first conductivity type, and a sixth transistor of the second conductivity type. The first transistor receives the input signal at a control terminal of the first transistor and, upon turning on in response to the input signal, supplies a first power supply voltage to a first node. The second transistor receives the input signal at a control terminal of the second transistor and, upon turning on in response to the input signal, supplies a second power supply voltage to a second node. The third transistor receives, at a control terminal of the third transistor, a signal of a phase reverse to a signal on the first node as a first reverse phase signal and, upon turning on in response to the first reverse phase signal, connects between the first node and the second node. The fourth transistor receives, at a control terminal of the fourth transistor, a signal of a phase reverse to a signal on the second node as a second reverse phase signal and, upon turning on in response to the second reverse phase signal, connects between the first node and the second node. The fifth transistor receives the second reverse phase signal at a control terminal of the fifth transistor and, upon turning on in response to the second reverse phase signal, supplies the first power supply voltage to the output terminal. The sixth transistor receives the first reverse phase signal at a control terminal of the sixth transistor and, upon turning on in response to the first reverse phase signal, supplies the second power supply voltage to the output terminal.

A charge pump device according to an embodiment of the disclosure includes the output buffer circuit described above and a charge pump circuit. The charge pump circuit receives the output signal outputted from the output buffer circuit as a drive signal, and generates a voltage obtained by taking one of the first power supply voltage and the second power supply voltage as reference and amplifying a voltage difference between the first power supply voltage and the second power supply voltage according to the drive signal.

A display drive device according to an embodiment of the disclosure generates a signal group driving a display panel provided with a plurality of display cells based on a video signal. The display drive device includes a power supply part. The power supply part includes the output buffer circuit described above and a charge pump circuit. The charge pump circuit receives the output signal outputted from the output buffer circuit as a drive signal, and generates a voltage obtained by taking one of the first power supply voltage and the second power supply voltage as reference and amplifying a voltage difference between the first power supply voltage and the second power supply voltage according to the drive signal. The power supply part generates a power supply voltage for generating the signal group based on the voltage obtained by amplifying the voltage difference.

A display device according to an embodiment of the disclosure includes a display panel on which a plurality of display cells are arranged, and a display drive device that generates a signal group driving the display panel based on a video signal. The display drive device includes a power supply part. The power supply part includes the output buffer circuit described above and a charge pump circuit. The charge pump circuit receives the output signal outputted from the output buffer circuit as a drive signal, and generates a voltage obtained by taking one of the first power supply voltage and the second power supply voltage as reference and amplifying a voltage difference between the first power supply voltage and the second power supply voltage according to the drive signal. The power supply part generates a power supply voltage for generating the signal group based on the voltage obtained by amplifying the voltage difference.

In the output buffer circuit according to the disclosure, with eight transistors to be described below, a through current is prevented from flowing between a transistor that supplies a first power supply voltage to an output terminal upon turning on based on a signal received at its own control terminal, and a transistor that supplies a second power supply voltage to the output terminal upon turning on based on a signal received at its own control terminal.

That is, a first transistor receives an input signal at a control terminal of the first transistor and, upon turning on in response to the input signal, supplies a first power supply voltage to a first node. A second transistor receives the input signal at a control terminal of the second transistor and, upon turning on in response to the input signal, supplies a second power supply voltage to a second node. A third transistor receives, at a control terminal of the third transistor, a first reverse phase signal obtained by inverting a phase of a signal on the first node by a first inverter composed of two transistors and, upon turning on in response to the first reverse phase signal, connects between the first node and the second node. A fourth transistor receives, at a control terminal of the fourth transistor, a second reverse phase signal obtained by inverting a phase of a signal on the second node by a second inverter composed of two transistors and, upon turning on in response to the second reverse phase signal, connects between the first node and the second node.

Thus, compared to the configuration described in Patent Document 1 which requires twelve transistors for preventing a through current, it is possible to reduce the circuit area.

Furthermore, according to the disclosure, in the case of realizing either a non-inverting buffer or an inverting buffer, it is possible to set the input capacitance only to the control terminal of each of the first transistor and the second transistor without interposing two inverters at a rear stage of the input terminal, so high-speed response is achieved.

DESCRIPTION OF THE EMBODIMENTS

Embodiments of the disclosure provide an output buffer circuit, a semiconductor device, a display driver, and a display device capable of suppressing power consumption and occurrence of noise accompanying a through current and achieving reduction in a circuit area and high-speed response.

Embodiment 1

Figure 1:
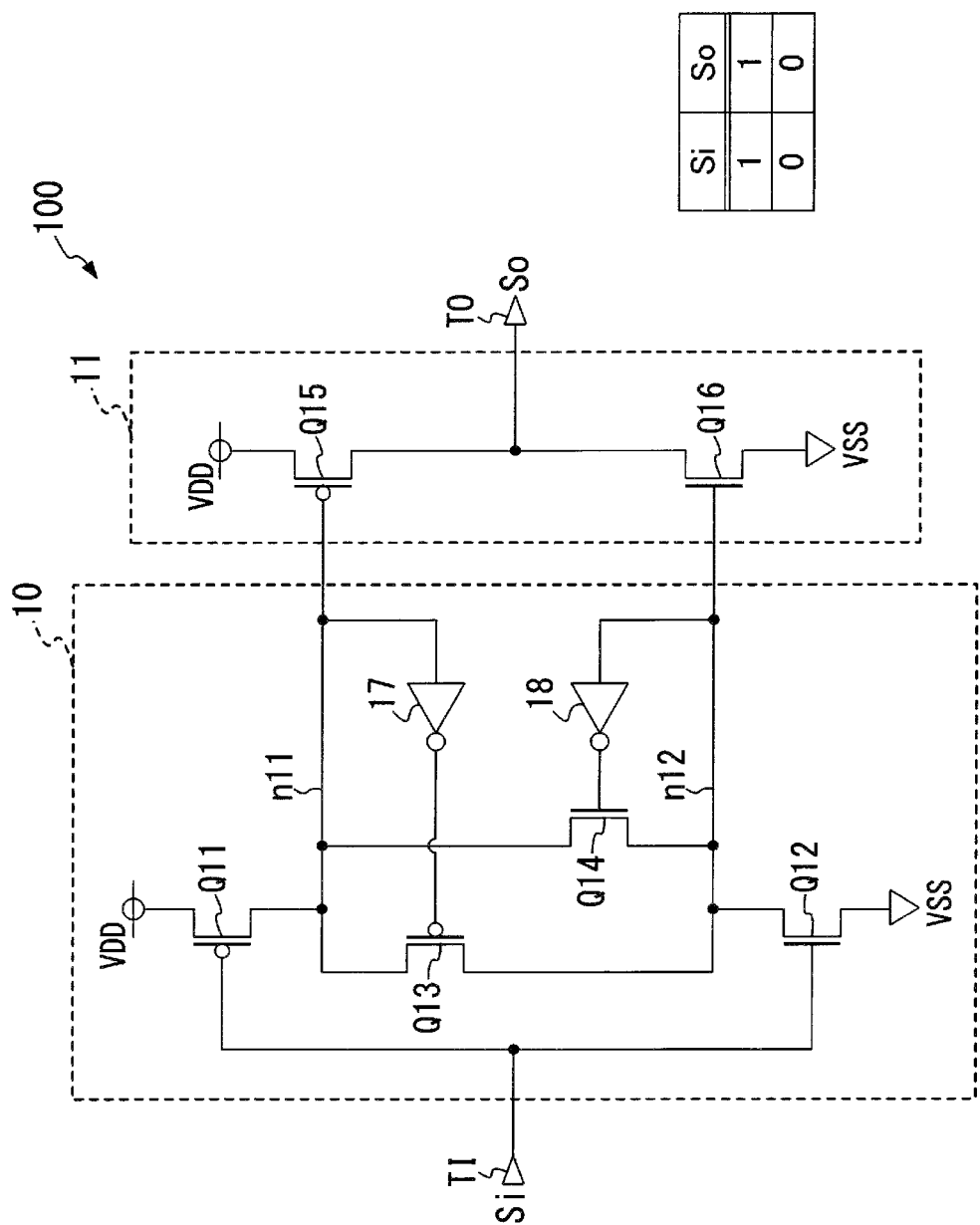
FIG. 1 is a circuit diagram showing the configuration of an output buffer circuit 100.

FIG. 1 is a circuit diagram showing the configuration of an output buffer circuit 100 as an example of an output buffer circuit according to the disclosure.

The output buffer circuit 100 is a so-called non-inverting buffer that is provided between two power supply voltages, generates an output signal So obtained by amplifying a current of a signal maintaining a phase of a binary (logic level 0 or 1) input signal Si received at an input terminal TI, and outputs the output signal So via an output terminal TO. The actual signal level of the logic level 1 in the input signal Si is, for example, a power supply voltage VDD, and the signal level of the logic level 0 is, for example, a ground voltage VSS.

The output buffer circuit 100 is formed, for example, on a semiconductor IC chip as a semiconductor device, and includes a timing adjustment part 10 and an output part 11.

The timing adjustment part 10 is composed of P-channel transistors Q11 and Q13, N-channel transistors Q12 and Q14, and inverters 17 and 18.

In the timing adjustment part 10, the input terminal TI is connected to the gate of each of the transistors Q11 and Q12. The power supply voltage VDD is applied to the source of the transistor Q11, and the drain of the transistor Q11 is connected, via a node n11, to the source of the transistor Q13, the drain of the transistor Q14, and the input terminal of the inverter 17. The ground voltage VSS is applied to the source of the transistor Q12, and the drain of the transistor Q12 is connected, via a node n12, to the drain of the transistor Q13, the source of the transistor Q14, and the input terminal of the inverter 18.

Further, in the timing adjustment part 10, the gate of the transistor Q13 is connected to the output terminal of the inverter 17, and the gate of the transistor Q14 is connected to the output terminal of the inverter 18.

The output part 11 includes a P-channel transistor Q15 and an N-channel transistor Q16.

In the output part 11, the gate of the transistor Q15 is connected to the node n11, and the gate of the transistor Q16 is connected to the node n12. The power supply voltage VDD is applied to the source of the transistor Q15, and the ground voltage VSS is applied to the source of the transistor Q16. The drain of each of the transistors Q15 and Q16 is connected to the output terminal TO.

Next, an internal operation of the output buffer circuit 100 will be described.

Figure 2:
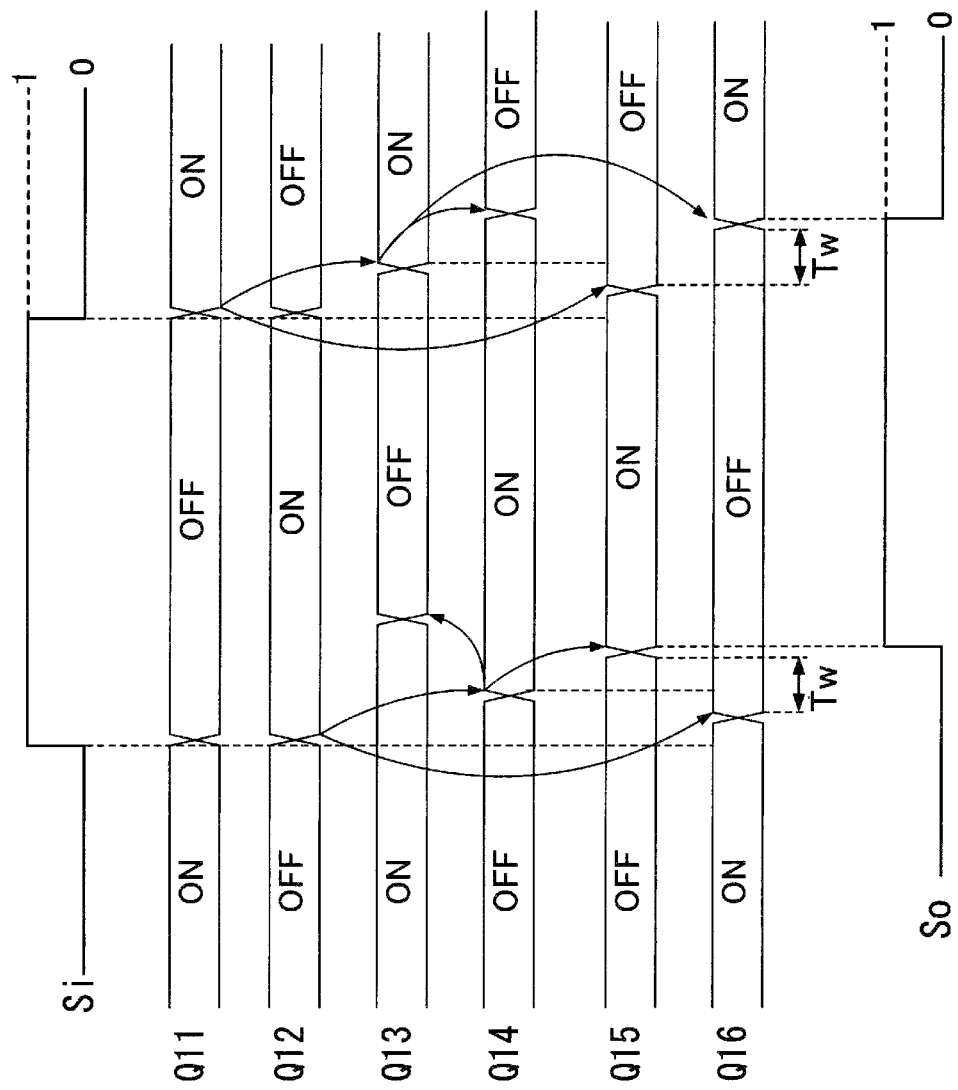
FIG. 2 is a time chart representing an internal operation of the output buffer circuit 100.

FIG. 2 is a time chart showing an internal operation of the output buffer circuit 100 in the case of receiving an input signal Si that transitions from a state of the logic level 0 (ground voltage VSS) to a state of the logic level 1 (power supply voltage VDD) and then returns to the state of the logic level 0. Hereinafter, the state of the power supply voltage VDD will be denoted as the logic level 1, and the state of the ground voltage VSS will be denoted as the logic level 0.

First, in response to the input signal Si of the logic level 0, as shown in FIG. 2, the transistor Q11 turns on and the transistor Q12 turns off. Accordingly, a signal of the logic level 1 is supplied to the node n11 via the transistor Q11.

Then, the inverter 17 supplies, to the gate of the transistor Q13, a signal of the logic level 0 obtained by inverting the phase of the signal of the logic level 1 supplied to the node n11.

Accordingly, the transistor Q13 turns on, and the signal of the logic level 1 supplied to the node n11 is supplied to the node n12 via the transistor Q13. Then, with the inverter 18 supplying, to the gate of the transistor Q14, a signal of the logic level 0 obtained by inverting the phase of the signal of the logic level 1 supplied to the node n12, as shown in FIG. 2, the transistor Q14 is turned off.

As a result, in response to the signal of the logic level 1 supplied to the node n11, the transistor Q15 of the output part 11 turns off, and in response to the signal of the logic level 1 supplied to the node n12, the transistor Q16 of the output part 11 turns on.

Thus, while the input signal Si is in the state of the logic level 0, the ground voltage VSS is applied to the output terminal TO via the transistor Q16, and as shown in FIG. 2, an output signal So representing the logic level 0 is outputted via the output terminal TO.

Subsequently, as shown in FIG. 2, upon transition of the input signal Si from the logic level 0 to 1, the transistor Q11 switches off and the transistor Q12 switches on.

Upon switching of the transistor Q12 to the on state, a signal of the logic level 0 is supplied to the inverter 18 and the gate of the transistor Q16 via the transistor Q12 and the node n12. Accordingly, as shown in FIG. 2, first, the transistor Q16 switches from the on state to the off state, and then, after elapse of an element delay of the inverter 18, the transistor Q14 switches from the off state to the on state. Upon switching of the transistor Q14 to the on state, the signal of the logic level 0 supplied to the node n12 is supplied to the inverter 17 and the gate of the transistor Q15 via the transistor Q14 and the node n11.

As a result, the transistor Q15 switches from the off state to the on state, and then, after elapse of an element delay of the inverter 17, the transistor Q13 switches from the on state to the off state.

Thus, upon transition of the input signal Si from the logic level 0 to 1, the power supply voltage VDD is applied to the output terminal TO via the transistor Q15, and as shown in FIG. 2, an output signal So representing the logic level 1 is outputted via the output terminal TO.

Subsequently, as shown in FIG. 2, upon transition of the input signal Si from the logic level 1 to 0, the transistor Q11 switches from the off state to the on state, and the transistor Q12 switches from the on state to the off state. Upon switching of the transistor Q11 to the on state, a signal of the logic level 1 is supplied to the inverter 17 and the gate of the transistor Q15 via the transistor Q11 and the node n11.

Accordingly, first, the transistor Q15 switches from the on state to the off state, and then, after elapse of an element delay of the inverter 17, the transistor Q13 switches from the off state to the on state. Upon switching of the transistor Q13 to the on state, the signal of the logic level 1 supplied to the node n11 is supplied to the inverter 18 and the gate of the transistor Q16 via the transistor Q13 and the node n12.

As a result, as shown in FIG. 2, first, the transistor Q16 switches from the off state to the on state, and then, after elapse of an element delay of the inverter 18, the transistor Q14 switches from the on state to the off state.

Thus, upon transition of the input signal Si from the logic level 1 to 0, the ground voltage VSS is applied to the output terminal TO via the transistor Q16, and as shown in FIG. 2, an output signal So representing the logic level 0 is outputted via the output terminal TO.

As described in detail above, according to the timing adjustment part 10, in response to transition of the input signal Si from the logic level 0 to 1, as shown in FIG. 2, after elapse of a period Tw from transition of the transistor Q16 of the output part 11 from the on state to the off state, the transistor Q15 of the output part 11 transitions from the off state to the on state. Further, in response to transition of the input signal Si from the logic level 1 to 0, as shown in FIG. 2, after elapse of the period Tw from transition of the transistor Q15 of the output part 11 from the on state to the off state, the transistor Q16 of the output part 11 transitions from the off state to the on state.

Thus, according to the timing adjustment part 10, the transistors Q15 and Q16 complementarily switch from the off (on) state to the on (off) state with a period Tw provided in-between during which both the transistors Q15 and Q16 turn off, so simultaneous turn-on of the two transistors is avoided. Accordingly, it is possible to prevent a through current flowing between the transistors Q15 and Q16 and suppress an increase in power consumption and occurrence of noise accompanying the through current.

Further, with a total of eight transistors including four transistors of the inverters 17 and 18 and the transistors Q11 to Q14, the timing adjustment part 10 prevents a through current flowing between the transistors Q15 and Q16 of the output part 11. Thus, compared to the timing adjustment part as described in Patent Document 1 which requires twelve transistors for preventing the through current, it is possible to reduce the circuit area.

Moreover, in the output buffer circuit 100, compared to the output buffer circuit 10 described in FIG. 1 of Patent Document 1, the number of transistors connected to the input terminal TI and the input terminals (gates of the transistors Q15 and Q16) of the output part 11 is reduced, and parasitic capacitance is reduced, so high-speed response becomes possible.

In brief, in the output buffer circuit 100, when outputting, from the output terminal TO, an output signal So in phase with an input signal Si received at the input terminal TI, by adopting a configuration including first to sixth transistors below, it is possible to suppress an increase in power consumption and noise occurrence accompanying a through current, and achieve reduction in the circuit area and high-speed response.

That is, a first transistor (Q11) receives an input signal (Si) at a control terminal (gate) of the first transistor (Q11) and, upon turning on in response to the input signal, supplies a first power supply voltage (VDD) to a first node (n11). A second transistor (Q12) receives the input signal (Si) at a control terminal (gate) of the second transistor (Q12) and, upon turning on in response to the input signal, supplies a second power supply voltage (VSS) to a second node (n12). A third transistor (Q13) receives, at a control terminal (gate) of the third transistor (Q13), a signal of a phase reverse to the signal on the first node (n11) as a first reverse phase signal and, upon turning on in response to the first reverse phase signal, connects between the first and second nodes. A fourth transistor (Q14) receives, at a control terminal (gate) of the fourth transistor (Q14), a signal of a phase reverse to the signal on the second node (n12) as a second reverse phase signal and, upon turning on in response to the second reverse phase signal, connects between the first and second nodes. A fifth transistor (Q15) receives the signal on the first node (n11) at a control terminal (gate) of the fifth transistor (Q15) and, upon turning on in response to the signal on the first node, supplies the first power supply voltage (VDD) to an output terminal (TO). A sixth transistor (Q16) receives the signal on the second node (n12) at a control terminal (gate) of the sixth transistor (Q16) and, upon turning on in response to the signal on the second node, supplies the second power supply voltage (VSS) to the output terminal (TO).

Embodiment 2

Figure 3:
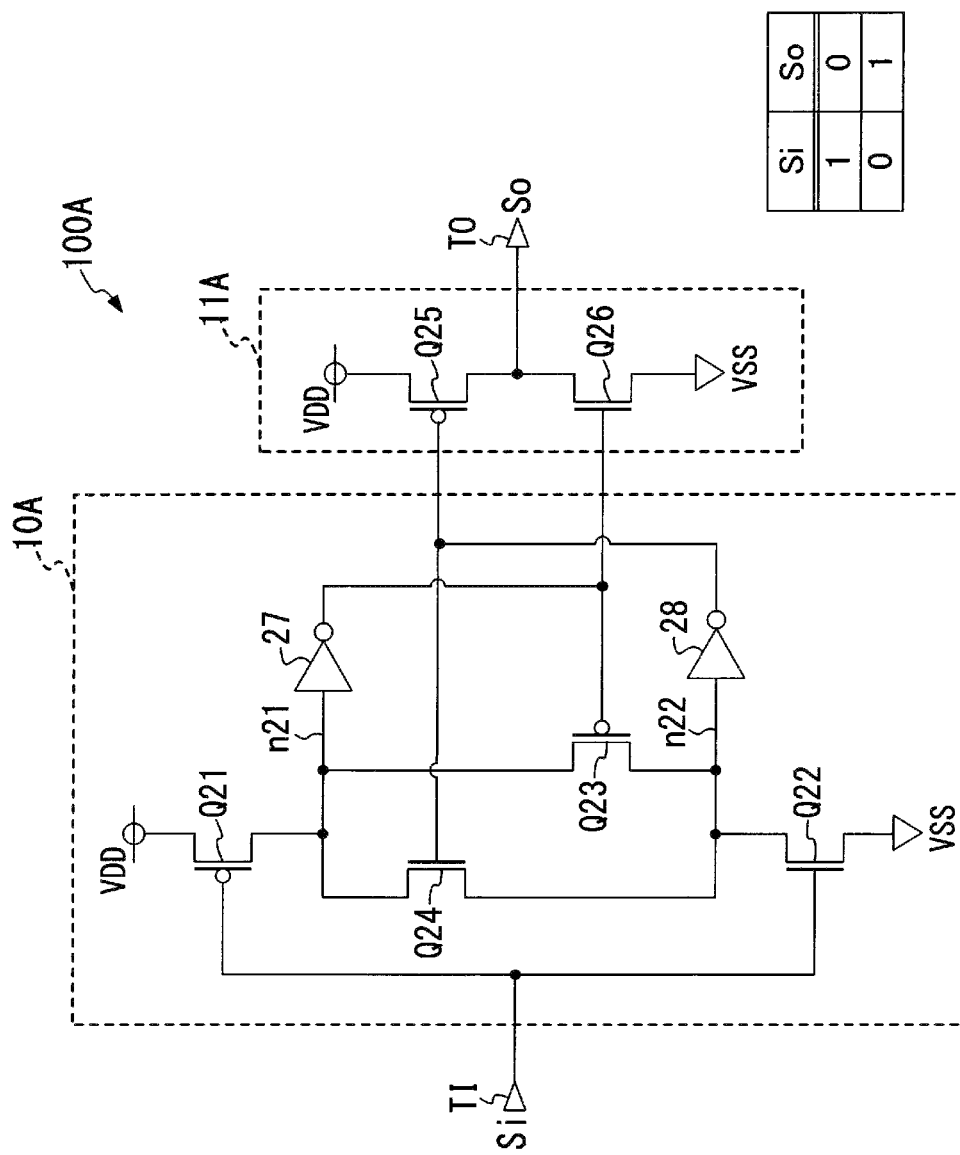
FIG. 3 is a circuit diagram showing the configuration of an output buffer circuit 100A as a modification example of the output buffer circuit 100.

FIG. 3 is a circuit diagram showing the configuration of an output buffer circuit 100A as a modification example of the output buffer circuit 100.

The output buffer circuit 100A is a so-called inverting buffer that is provided between two power supply voltages, generates an output signal So obtained by inverting the phase of a binary (logic level 0 or 1) input signal Si received at an input terminal TI and amplifying the current of the signal, and outputs the output signal So via an output terminal TO. The actual signal level of the logic level 1 in the input signal Si is, for example, a power supply voltage VDD, and the signal level of the logic level 0 is, for example, a ground voltage VSS.

The output buffer circuit 100A is formed, for example, on a semiconductor IC chip as a semiconductor device, and includes a timing adjustment part 10A and an output part 11A.

The timing adjustment part 10A is composed of P-channel transistors Q21 and Q23, N-channel transistors Q22 and Q24, and inverters 27 and 28.

In the timing adjustment part 10A, the input terminal TI is connected to the gate of each of the transistors Q21 and Q22. The power supply voltage VDD is applied to the source of the transistor Q21, and the drain of the transistor Q21 is connected, via a node n21, to the source of the transistor Q23, the drain of the transistor Q24, and the input terminal of the inverter 27. The ground voltage VSS is applied to the source of the transistor Q22, and the drain of the transistor Q22 is connected, via a node n22, to the drain of the transistor Q23, the source of the transistor Q24, and the input terminal of the inverter 28.

Moreover, in the timing adjustment part 10A, the output terminal of the inverter 27 is connected to the gate of each of the transistor Q23 and an N-channel MOS transistor Q26 of the output part 11A, and the output terminal of the inverter 28 is connected to the gate of each of the transistor Q24 and a P-channel MOS transistor Q25 of the output part 11A.

The output part 11A includes the transistors Q25 and Q26 described above.

In the output part 11A, the power supply voltage VDD is applied to the source of the transistor Q25, and the ground voltage VSS is applied to the source of the transistor Q26. The drain of each of the transistors Q25 and Q26 is connected to the output terminal TO.

According to the output buffer circuit 100A with the configuration shown in FIG. 3, in response to an input signal Si having a signal level that transitions in a sequence of the logic level 0, 1, and 0, a signal obtained by inverting the phase, that is, an output signal So having a signal level that transitions in a sequence of the logic level 1, 0, and 1, is outputted.

At this time, according to the timing adjustment part 10A, in response to transition of the input signal Si from the logic level 0 to 1, after elapse of a period Tw as shown in FIG. 2 from transition of the transistor Q25 of the output part 11A from the on state to the off state, the transistor Q26 of the output part 11A transitions from the off state to the on state. Further, in response to transition of the input signal Si from the logic level 1 to 0, after elapse of the period Tw as shown in FIG. 2 from transition of the transistor Q26 of the output part 11A from the on state to the off state, the transistor Q25 of the output part 11A transitions from the off state to the on state.

Thus, according to the timing adjustment part 10A, the transistors Q25 and Q26 complementarily switch from the off (on) state to the on (off) state with a period provided in-between during which both the transistors Q25 and Q26 turn off, so simultaneous turn-on of the two transistors is avoided. Accordingly, it is possible to prevent a through current flowing between the transistors Q25 and Q26 and suppress an increase in power consumption and occurrence of noise accompanying the through current.

Further, with a total of eight transistors including four transistors of the inverters 27 and 28 and the transistors Q21 to Q24, the timing adjustment part 10A prevents a through current flowing between the transistors Q25 and Q26 of the output part 11A. Thus, compared to the timing adjustment part as described in Patent Document 1 which requires twelve transistors for preventing the through current, it is possible to reduce the circuit area.

Moreover, in the output buffer circuit 100A, when outputting an output signal of a phase reverse to an input signal, the number of transistors connected to the input terminal TI and the input terminals (gates of the transistors Q25 and Q26) of the output part 11A is reduced, and parasitic capacitance is reduced, so high-speed response becomes possible.

In brief, in the output buffer circuit 100A, when outputting, from the output terminal TO, an output signal So of a phase reverse to an input signal Si received at the input terminal TI, by adopting a configuration including first to sixth transistors below, it is possible to suppress an increase in power consumption and noise occurrence accompanying a through current and achieve reduction in the circuit area and high-speed response.

That is, a first transistor (Q21) receives an input signal (Si) at a control terminal (gate) of the first transistor (Q21) and, upon turning on in response to the input signal, supplies a first power supply voltage (VDD) to a first node (n21). A second transistor (Q22) receives the input signal (Si) at a control terminal (gate) of the second transistor (Q22) and, upon turning on in response to the input signal, supplies a second power supply voltage (VSS) to a second node (n22). A third transistor (Q23) receives, at a control terminal (gate) of the third transistor (Q23), a signal of a phase reverse to the signal on the first node (n21) as a first reverse phase signal and, upon turning on in response to the first reverse phase signal, connects between the first and second nodes. A fourth transistor (Q24) receives, at a control terminal (gate) of the fourth transistor (Q24), a signal of a phase reverse to the signal on the second node (n22) as a second reverse phase signal and, upon turning on in response to the second reverse phase signal, connects between the first and second nodes. A fifth transistor (Q25) receives the second reverse phase signal at a control terminal (gate) of the fifth transistor (Q25) and, upon turning on in response to the second reverse phase signal, supplies the first power supply voltage (VDD) to an output terminal (TO). A sixth transistor (Q26) receives the first reverse phase signal at a control terminal (gate) of the sixth transistor (Q26) and, upon turning on in response to the first reverse phase signal, supplies the second power supply voltage (VSS) to the output terminal (TO).

Embodiment 3

Figure 4:
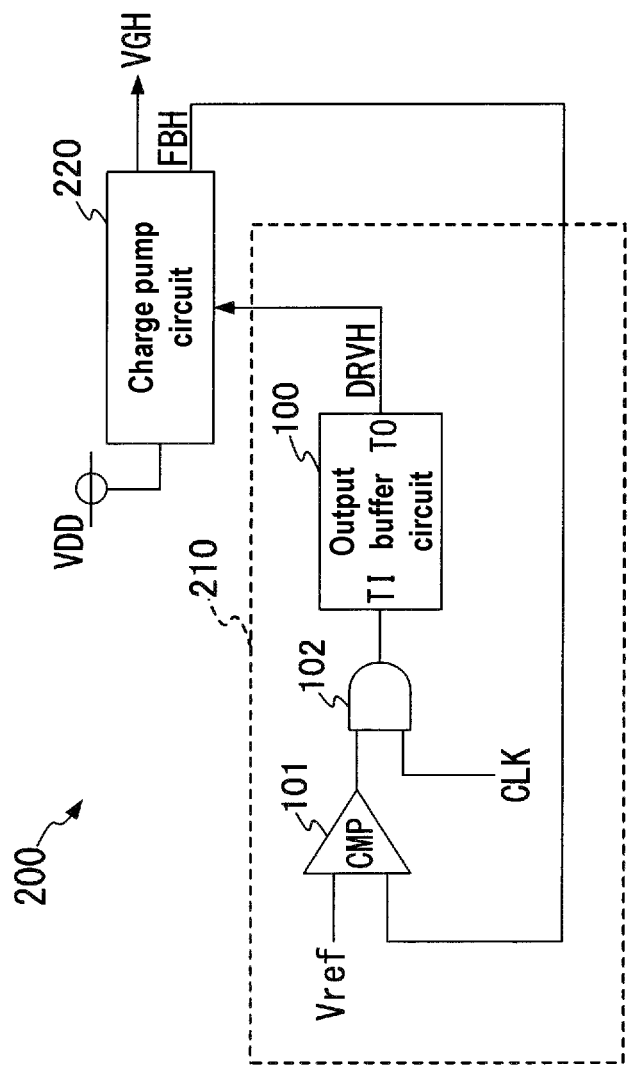
FIG. 4 is a block diagram showing the configuration of a charge pump device 200.

FIG. 4 is a block diagram showing the configuration of a charge pump device 200 including the output buffer circuit 100 shown in FIG. 1.

The charge pump device 200, for example, boosts the power supply voltage VDD with the ground voltage VSS as reference and causes a detection voltage FBH following a boost voltage VGH to correspond to a reference voltage Vref to thereby generate and output a boost voltage VGH converged to a desired voltage value. A load circuit (not shown) is connected to the output terminal of the charge pump device 200 which outputs the boost voltage VGH, and the boost voltage VGH is supplied as a power supply voltage of the load circuit. The charge pump device 200 may also generate and output a voltage obtained by stepping down the ground voltage VSS with the power supply voltage VDD as reference. Hereinafter, for convenience of description, the case of a charge pump device that generates and outputs a boost voltage VGH will be described.

The charge pump device 200 includes, for example, a drive circuit 210 formed on a semiconductor IC chip and a charge pump circuit 220 provided outside the semiconductor IC chip.

The drive circuit 210 includes, for example, a comparator 101, an AND gate 102, and an output buffer circuit 100.

The comparator 101 receives the reference voltage Vref and the detection voltage FBH having a voltage value following the boost voltage VGH and compares the magnitudes of the two. The comparator 101 generates a boost execution signal of the logic level 1 that prompts a boost operation in the case where the detection voltage FBH is lower than the reference voltage Vref, and generates a boost execution signal of the logic level 0 in the case where the detection voltage FBH becomes equal to or higher than the reference voltage Vref. The comparator 101 supplies the generated boost execution signal to the AND gate 102.

The AND gate 102 receives a binary (0, 1) clock signal CLK having a predetermined frequency together with the boost execution signal described above. In the case where the boost execution signal indicates the logic level 0, the AND gate 102 supplies a one-value drive signal of the logic level 0 as an input signal Si to the input terminal TI of the output buffer circuit 100. Further, in the case where the boost execution signal indicates the logic level 1, the AND gate 102 supplies a binary drive signal that alternately repeats a state of the logic level 1 and a state of the logic level 0 according to the clock signal CLK to the input terminal TI of the output buffer circuit 100.

The output buffer circuit 100 has the configuration shown in FIG. 1, and supplies a signal obtained by amplifying the current of the drive signal received at the input terminal TI as a drive signal DRVH to the charge pump circuit 220 via the output terminal TO.

Figure 5:
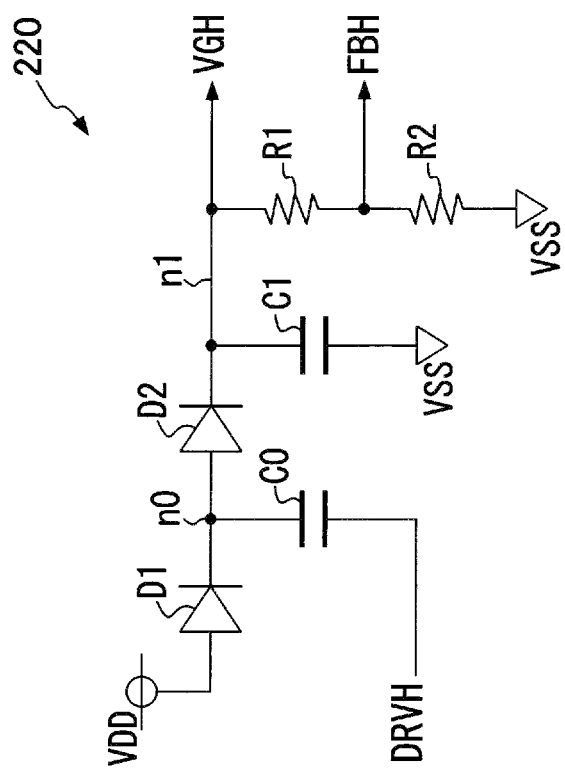
FIG. 5 is a circuit diagram showing the configuration of a charge pump circuit 220.

FIG. 5 is a circuit diagram showing an example of the configuration of a double-boost charge pump circuit 220. Although the charge pump circuit 220 may have a configuration of any boost ratio, for convenience of description, hereinafter, the case of a double-boost charge pump circuit will be described.

As shown in FIG. 5, the charge pump circuit 220 includes diodes D1 and D2, capacitors C0 and C1, and resistors R1 and R2.

The power supply voltage VDD is applied to the anode of the diode D1, and the cathode of the diode D1 is connected to the anode of the diode D2 via a node n0. The drive signal DRVH of the output buffer circuit 100 is supplied to one terminal of the capacitor C0, and the other terminal of the capacitor C0 is connected to the node n0. The cathode of the diode D2 is connected to one terminal of the capacitor C1 and one terminal of the resistor R1 via a node n1. The ground voltage VSS is applied to the other terminal of the capacitor C1, and the other terminal of the resistor R1 is connected to one terminal of the resistor R2. The ground voltage VSS is applied to the other terminal of the resistor R2.

With the configuration shown in FIG. 5, in the case of receiving a drive signal DRVH that alternately repeats the state of the logic level 0 and the state of the logic level 1, the charge pump circuit 220 repeatedly causes the one terminal of the capacitor C0 to charge and discharge according to the drive signal DRVH. Upon driving of the one terminal of the capacitor C0 to the ground voltage VSS by the drive signal DRVH, charge is accumulated in the capacitor C0 from the power supply voltage VDD via the diode D1 and the node n0. Then, upon driving of the one terminal of the capacitor C0 to the power supply voltage VDD by the drive signal DRVH, the charge accumulated in the capacitor C0 is supplied and retained in the capacitor C1 connected to the node n1 via the node n0 and the diode D1. By repeating the above operation, the boost voltage VGH supplied to the node n1 may be boosted up to approximately twice the power supply voltage VDD at maximum. However, in the case of the configuration of FIG. 5, the boost voltage becomes one that is lower than twice the power supply voltage VDD by the forward voltage of the diodes D1 and D2. The charge pump circuit 220 outputs this voltage on the node n1 as the boost voltage VGH, and supplies, to the comparator 101, a voltage obtained by dividing the boost voltage VGH by the resistors R1 and R2 as the detection voltage FBH. Then, as shown in FIG. 4, by controlling binary drive (charge-discharge operation) and one-value drive (charge-discharge stop) of the drive signal DRVH according to the comparison of magnitude between the reference voltage Vref and the detection voltage FBH, it is possible to output a desired boost voltage VGH corresponding to the reference voltage Vref.

At this time, the charge pump device 200 adopts the output buffer circuit 100 having the configuration shown in FIG. 1 as the output buffer circuit included in the drive circuit 210 that drives the charge pump circuit 220. Thus, according to the configuration of the charge pump device 200 including the output buffer circuit 100 shown in FIG. 1, it is possible to suppress power consumption and occurrence of noise in the drive circuit 210 that drives the charge pump circuit 220 and achieve high-speed operation and reduction in the circuit area of the drive circuit 210 formed on the semiconductor IC chip.

Embodiment 4

Figure 6:
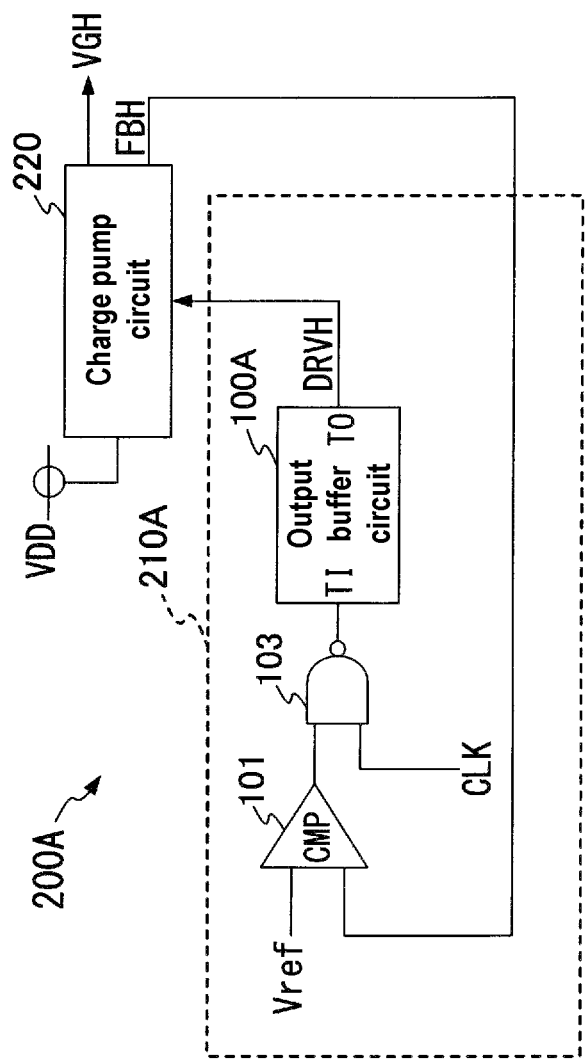
FIG. 6 is a block diagram showing the configuration of a charge pump device 200A.

FIG. 6 is a block diagram showing the configuration of a charge pump device 200A including the output buffer circuit 100A shown in FIG. 3. Similar to FIG. 4, the charge pump device 200A includes a drive circuit 210A formed on a semiconductor IC chip and a charge pump circuit 220 provided outside the semiconductor IC chip.

In the configuration shown in FIG. 6, the drive circuit 210A is adopted instead of the drive circuit 210 in FIG. 4, the output buffer circuit 100A having the configuration shown in FIG. 3 is adopted instead of the output buffer circuit 100, and a NAND gate 103 is adopted instead of the AND gate 102. The other configurations and operations thereof are identical to those shown in FIG. 4.

In FIG. 6, the comparator 101 receives a reference voltage Vref and a detection voltage FBH generated by the charge pump circuit 220 and compares the magnitudes of the two. The comparator 101 generates a boost execution signal of the logic level 1 that prompts a boost operation in the case where the detection voltage FBH is lower than the reference voltage Vref, and generates a boost execution signal of the logic level 0 in the case where the detection voltage FBH becomes equal to or higher than the reference voltage Vref. The comparator 101 supplies the generated boost execution signal to the NAND gate 103.

The NAND gate 103 receives a binary (0, 1) clock signal CLK having a predetermined frequency together with the boost execution signal described above. In the case where the boost execution signal indicates the logic level 0, the NAND gate 103 supplies a one-value drive signal of the logic level 1 as an input signal Si to the input terminal TI of the output buffer circuit 100A. Further, in the case where the boost execution signal indicates the logic level 1, the NAND gate 103 supplies a binary drive signal that alternately repeats a state of the logic level 1 and a state of the logic level 0 according to the clock signal CLK to the input terminal TI of the output buffer circuit 100A.

The output buffer circuit 100A has the configuration shown in FIG. 3, and supplies a reverse phase signal obtained by amplifying the current of the drive signal received at the input terminal TI as a drive signal DRVH to the charge pump circuit 220 via the output terminal TO. The configuration of the charge pump circuit 220 is the same as that shown in FIG. 4 and the operation thereof is also the same, so descriptions thereof will be omitted.

Thus, with the configuration shown in FIG. 6, the charge pump device 200A boosts the power supply voltage VDD according to the drive signal DRVH in the same manner as the charge pump device 200 shown in FIG. 4, and generates the boost voltage VGH as a desired voltage corresponding to the reference voltage Vref.

At this time, in the charge pump device 200A, as shown in FIG. 6, the output buffer circuit 100A shown in FIG. 3 is adopted as the output buffer circuit included in the drive circuit 210A that drives the charge pump circuit 220.

Thus, according to the configuration of the charge pump device 200A including the output buffer circuit 100A shown in FIG. 3, it is possible to suppress power consumption and occurrence of noise in the drive circuit 210A driving the charge pump circuit 220 and achieve high-speed operation and reduction in the circuit area of the drive circuit 210A formed on the semiconductor IC chip.

Embodiment 5

Figure 7:
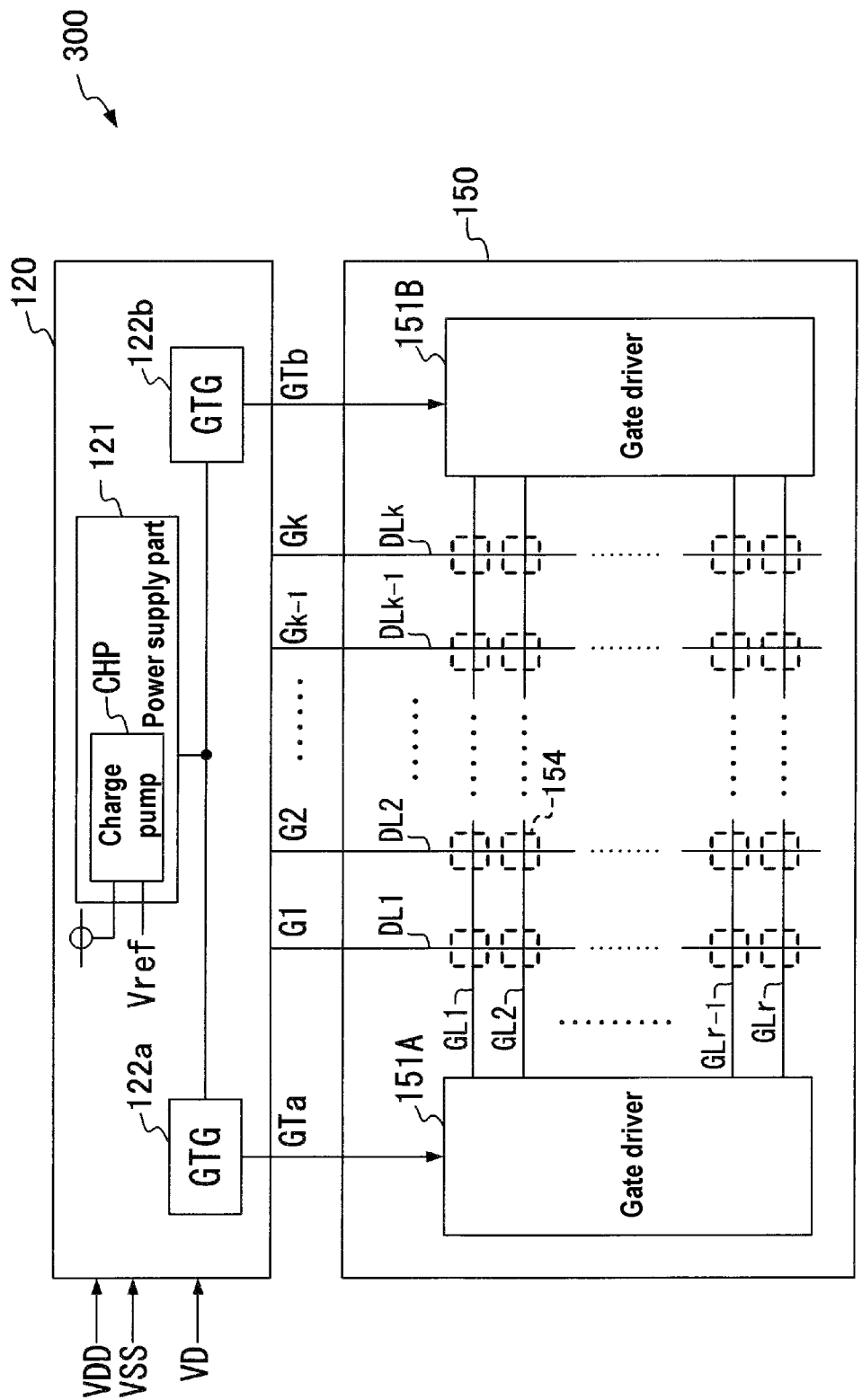
FIG. 7 is a block diagram showing a schematic configuration of a display device 300.

FIG. 7 is a block diagram showing a schematic configuration of a display device 300 including a charge pump device CHP having the same configuration as the charge pump device 200 or 200A shown in FIG. 4 or FIG. 6.

As shown in FIG. 7, the display device 300 includes a display panel 150 formed with gate lines GL1 to GLr (where r is an integer of 2 or more) each arranged along the horizontal direction of the screen, and data lines DL1 to DLk (where k is an integer of 2 or more) arranged intersecting each gate line, and a display drive device 120 including a drive circuit of the data lines. On the display panel 150, a plurality of display cells 154 bearing each pixel are formed at intersections between each of the gate lines GL1 to GLr and each of the data lines DL1 to DLk.

Furthermore, gate drivers 151A and 151B formed integrally with the display panel 150 are arranged on the display panel 150.

The gate driver 151A is connected to one end of each of the gate lines GL1 to GLr, and the gate driver 151B is connected to the other end of each of the gate lines GL1 to GLr. The gate driver 151A sequentially generates gate selection signals Vg(r) to Vg1 at the timing indicated by a gate timing signal GTa supplied from the display drive device 120, and supplies each of the gate selection signals Vg(r) to Vg1 to the one end of each of the gate lines GLr to GL1. The gate driver 151B sequentially generates gate selection signals Vg(r) to Vg1 at the timing indicated by a gate timing signal GTb supplied from the display drive device 120, and supplies each of the gate selection signals Vg(r) to Vg1 to the other end of each of the gate lines GLr to GL1.

The display drive device 120 receives a video signal VD, an external power supply voltage VDD, and a ground voltage VSS, generates drive signals G1 to Gk each having a voltage value corresponding to a brightness level based on the video signal VD, and supplies the drive signals G1 to Gk to the data lines DL1 to DLk. Furthermore, the display drive device 120 generates the gate timing signals GTa and GTb synchronized with each horizontal synchronization signal included in the video signal VD, and supplies each of the gate timing signals GTa and GTb to the gate drivers 151A and 151B.

Further, the display drive device 120 includes a power supply part 121 and gate timing generation parts 122*a* and 122*b*.

The power supply part 121 at least includes the charge pump device CHP having the same configuration as the charge pump device 200 (or 200A) shown in FIG. 4 or FIG. 6, and supplies a boost voltage VGH obtained by boosting the power supply voltage VDD using the charge pump device CHP as a power supply voltage to the gate timing generation parts 122*a* and 122*b*. Furthermore, the power supply part 121 may also include a charge pump device with a step-down function, and may supply a step-down voltage VGL obtained by stepping down the ground voltage VSS as a negative-side power supply voltage to the gate timing generation parts 122*a* and 122*b*. Further, the power supply part 121 may generate a power supply voltage for operating circuit blocks other than the gate timing generation parts 122*a* and 122*b* included in the display drive device 120 based on the boost voltage VGH or the step-down voltage VGL.

The gate timing generation part 122*a* generates a high-voltage gate timing signal GTa based on the power supply voltage (VGH, VGL) and supplies the gate timing signal GTa to the gate driver 151A at a timing synchronized with each horizontal synchronization signal included in the video signal VD. The gate timing generation part 122*b* generates a high-voltage gate timing signal GTb based on the power supply voltage (VGH, VGL) and supplies the gate timing signal GTb to the gate driver 151B at a timing synchronized with each horizontal synchronization signal included in the video signal VD.

Accordingly, in the display device 300, the power supply part 121 provided with the charge pump device CHP (200, 200A) shown in FIG. 4 or FIG. 6 including the output buffer circuit 100 or 100A shown in FIG. 1 or FIG. 3 is adopted as the power supply part that generates a power supply voltage used in the display drive device 120.

Thus, since it is possible to reduce the chip area of the semiconductor IC chip included in the display drive device 120 while suppressing power consumption and noise occurrence in the display drive device 120, it is possible to reduce the cost of the display panel 150.

What is claimed is:

1. An output buffer circuit which outputs, from an output terminal, an output signal of a phase reverse to an input signal received at an input terminal, the output buffer circuit comprising:
a first transistor of a first conductivity type that receives the input signal at a control terminal of the first transistor and, upon turning on in response to the input signal, supplies a first power supply voltage to a first node;
a second transistor of a second conductivity type that receives the input signal at a control terminal of the second transistor and, upon turning on in response to the input signal, supplies a second power supply voltage to a second node;
a third transistor of the first conductivity type that receives, at a control terminal of the third transistor, a signal of a phase reverse to a signal on the first node as a first reverse phase signal and, upon turning on in response to the first reverse phase signal, connects between the first node and the second node;
a fourth transistor of the second conductivity type that receives, at a control terminal of the fourth transistor, a signal of a phase reverse to a signal on the second node as a second reverse phase signal and, upon turning on in response to the second reverse phase signal, connects between the first node and the second node;
a fifth transistor of the first conductivity type that receives the second reverse phase signal at a control terminal of the fifth transistor and, upon turning on in response to the second reverse phase signal, supplies the first power supply voltage to the output terminal; and
a sixth transistor of the second conductivity type that receives the first reverse phase signal at a control terminal of the sixth transistor and, upon turning on in response to the first reverse phase signal, supplies the second power supply voltage to the output terminal.

2. The output buffer circuit according to claim 1, further comprising:
a first inverter that receives the signal on the first node and generates a signal obtained by inverting a phase of the signal on the first node as the first reverse phase signal; and
a second inverter that receives the signal on the second node and generates a signal obtained by inverting a phase of the signal on the second node as the second reverse phase signal.

* * * * *